(12) United States Patent
Lee et al.

(10) Patent No.: US 8,941,245 B2
(45) Date of Patent: Jan. 27, 2015

(54) SEMICONDUCTOR PACKAGE INCLUDING SEMICONDUCTOR CHIP WITH THROUGH OPENING

(75) Inventors: Chang-Cheol Lee, Hwaseong-si (KR); Hyun-Jun Kim, Hwaseong-si (KR); In-Young Lee, Yongin-si (KR); Ki-Kwon Jeong, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 315 days.

(21) Appl. No.: 13/533,473

(22) Filed: Jun. 26, 2012

(65) Prior Publication Data

US 2013/0105988 A1    May 2, 2013

(30) Foreign Application Priority Data

Oct. 26, 2011   (KR) .................. 10-2011-0110078

(51) Int. Cl.
| | | |
|---|---|---|
| H01L 23/52 | (2006.01) | |
| H01L 23/13 | (2006.01) | |
| H01L 25/065 | (2006.01) | |
| H01L 23/498 | (2006.01) | |
| H01L 21/56 | (2006.01) | |

(52) U.S. Cl.
CPC ............ H01L 23/13 (2013.01); H01L 25/0657 (2013.01); *H01L 23/49816* (2013.01); *H01L 21/565* (2013.01); *H01L 2224/16225* (2013.01); *H01L 2924/1815* (2013.01); *H01L 2225/06517* (2013.01); *H01L 2225/06513* (2013.01); *H01L 2225/06541* (2013.01); *H01L 2225/06565* (2013.01)

USPC ..... 257/777; 257/621; 257/778; 257/E25.005; 257/E25.006; 257/E21.503

(58) Field of Classification Search
USPC .......... 257/621, 777, 778, E25.005, E25.006, 257/E25.013, E25.021, E25.027, E23.085, 257/E21.503, E23.011
See application file for complete search history.

(56) References Cited

U.S. PATENT DOCUMENTS

| | | | |
|---|---|---|---|
| 6,404,062 B1 * | 6/2002 | Taniguchi et al. ............ | 257/778 |
| 6,717,252 B2 * | 4/2004 | Saeki ............................ | 257/686 |
| 7,402,901 B2 * | 7/2008 | Hatano et al. ................ | 257/684 |
| 7,919,846 B2 | 4/2011 | Hembree | |

FOREIGN PATENT DOCUMENTS

| | | |
|---|---|---|
| KR | 10-2005-0045628 A | 5/2005 |
| KR | 10-2007-0010312 A | 1/2007 |
| KR | 10-2010-0111469 A | 10/2010 |

\* cited by examiner

*Primary Examiner* — Jasmine Clark
(74) *Attorney, Agent, or Firm* — Sughrue Mion, PLLC

(57) ABSTRACT

A semiconductor package comprises a substrate having a first opening formed therethrough, a first semiconductor chip stacked on the substrate in a flip chip manner and having a second opening formed therethrough, a second semiconductor chip stacked on the first semiconductor chip in a flip chip manner and having a third opening formed therethrough, and a molding material covering the first semiconductor chip and the second semiconductor chip and filling up a space between the substrate and the first semiconductor chip, a space between the first semiconductor chip and the second semiconductor chip, and filling each of the first opening, the second opening, and the third opening.

19 Claims, 16 Drawing Sheets

1300

SEMICONDUCTOR PACKAGE INCLUDING SEMICONDUCTOR CHIP WITH THROUGH OPENING

CROSS-REFERENCE TO RELATED APPLICATION

This application claims priority, and all the benefits accruing therefrom under 35 U.S.C. 119, from Korean Patent Application No. 10-2011-0110078 filed on Oct. 26, 2011 in the Korean Intellectual Property Office, the contents of are herein incorporated by reference in their entirety.

BACKGROUND

1. Field

Apparatuses and methods consistent with exemplary embodiments relate to a semiconductor package including a semiconductor chip with a through opening.

2. Description of the Related Art

After a plurality of semiconductor chips are stacked on a substrate, an underfill is provided between the stacked semiconductor chips, or the semiconductor chips are molded with an epoxy molding compound (EMC), thereby forming a semiconductor package.

However, in the underfill process, the flow of the underfill solution from the outside of the semiconductor chip toward the center of the semiconductor chip may be slow. Accordingly, a void may be generated between bumps connecting the stacked semiconductor chips.

Further, in the molding process, before the EMC is filled between the stacked semiconductor chips, the semiconductor chip may be damaged by the pressure of the EMC positioned on the semiconductor chip. Further, while the pressure of the EMC positioned on the semiconductor chip is concentrated at a central portion of the semiconductor chip, stress may be applied to the bumps and a void may be generated between the bumps.

SUMMARY

One or more exemplary embodiments may provide a semiconductor package capable of reducing occurrence of a void and damage to semiconductor chips by improving fillability between the semiconductor chips.

According to an aspect of an exemplary embodiment, there is provided a semiconductor package comprising a substrate having a first opening formed therethrough, a first semiconductor chip stacked on the substrate in a flip chip manner and having a second opening formed therethrough, a second semiconductor chip stacked on the first semiconductor chip and having a third opening formed therethrough, and a molding material covering the first semiconductor chip and the second semiconductor chip and filling up a space between the substrate and the first semiconductor chip, a space between the first semiconductor chip and the second semiconductor chip, and filling each of the first opening, the second opening and the third opening.

According to an aspect of another exemplary embodiment, there is provided a semiconductor package comprising comprises a substrate having a first opening formed therethrough, a first semiconductor chip which is flip-chip bonded onto the substrate and has a second opening formed therethrough and a first through electrode, a second through electrode, and a third through electrode sequentially arranged in a first direction, and an epoxy molding compound (EMC) covering the first semiconductor chip, and filling up a space between the substrate and the first semiconductor chip, and the first opening and the second, wherein a distance between the first through electrode and the second through electrode is smaller than a distance between the second through electrode and the third through electrode, and the second opening is formed between the first through electrode and the second through electrode.

These objects are merely exemplary, and other objects will be described in or be apparent from the following description of exemplary embodiments.

BRIEF DESCRIPTION OF THE DRAWINGS

The above and/or other exemplary aspects and features will become more apparent by describing in detail exemplary embodiments with reference to the attached drawings, in which.

DETAILED DESCRIPTION OF THE EMBODIMENTS

Figure 1:
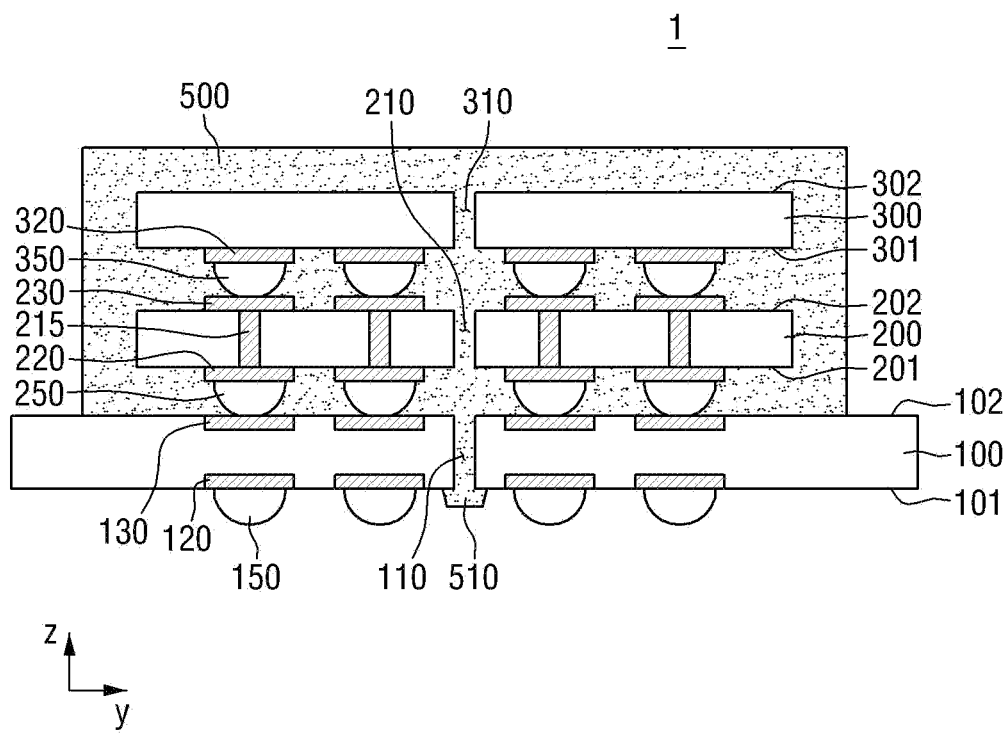
FIG. 1 is a cross-sectional view showing a semiconductor package in accordance with a first exemplary embodiment.

Advantages and features of exemplary embodiments and methods of accomplishing the same may be understood more readily by reference to the following detailed description and the accompanying drawings. Exemplary embodiments may, however, be embodied in many different forms and should not be construed as being limited to the embodiments set forth herein. Rather, these exemplary embodiments are provided so that this disclosure will be thorough and complete and will fully convey the inventive concept to those skilled in the art. In the drawings, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from exemplary embodiments.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
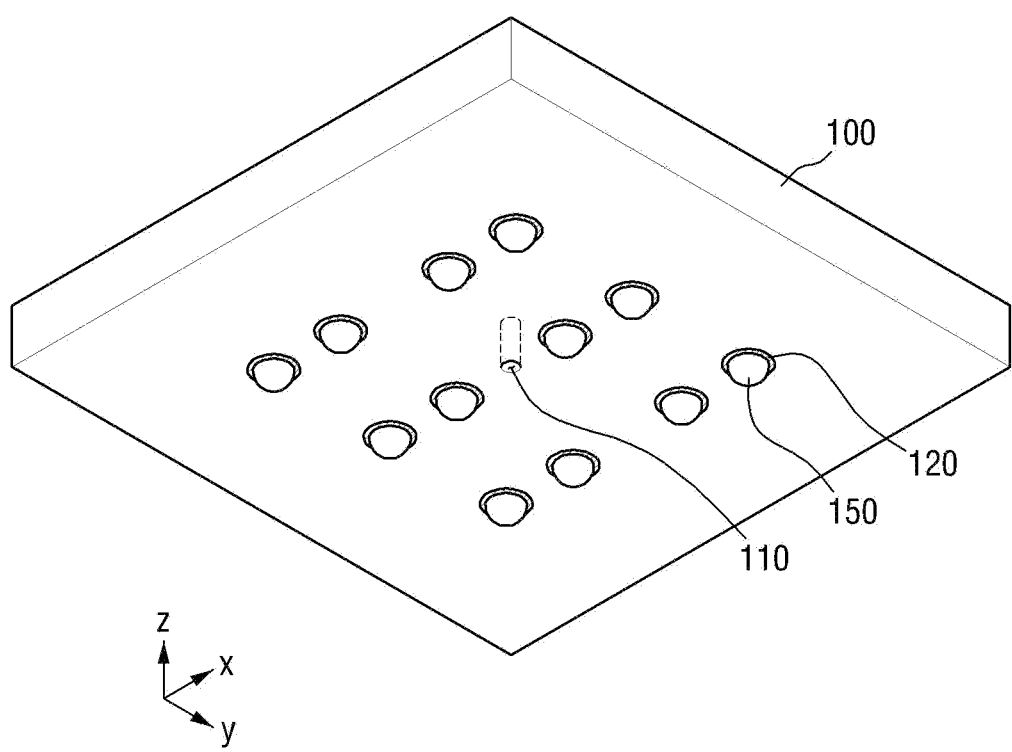
FIG. 2 is a perspective view of a substrate of FIG. 1.
Figure 3:
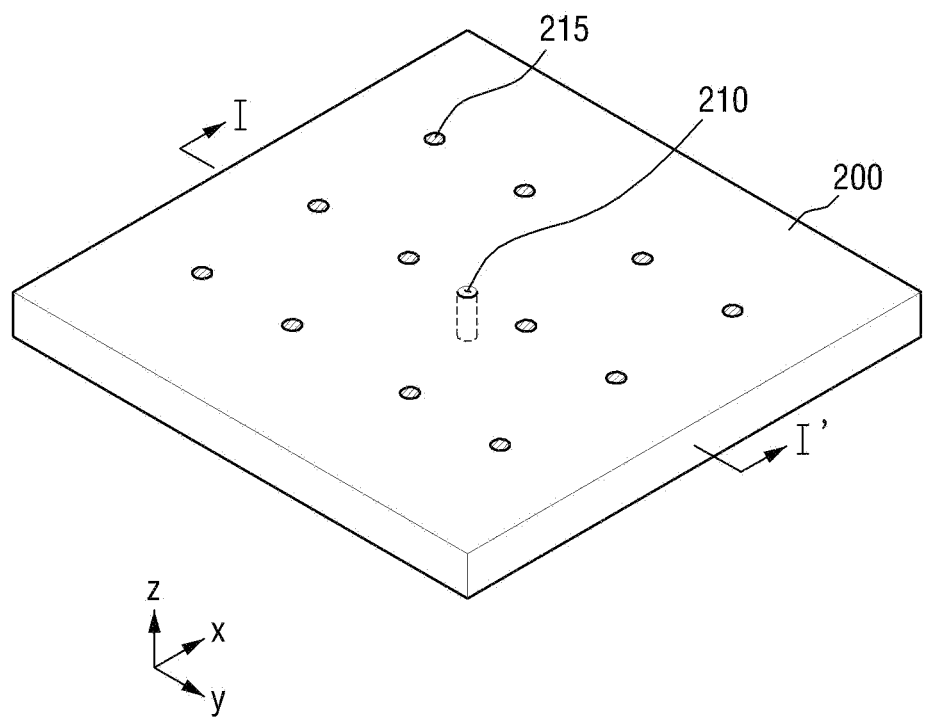
FIG. 3 is a perspective view of a first semiconductor chip of FIG. 1.
Figure 4:
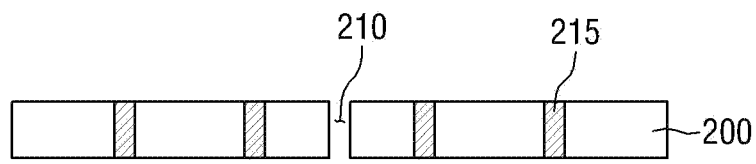
FIG. 4 is a cross-sectional view of the first semiconductor chip, which is taken along line I-I' of FIG. 3.

A semiconductor package in accordance with a first exemplary embodiment will be described with reference to FIGS. 1 to 4. FIG. 1 is a cross-sectional view showing the semiconductor package in accordance with the first exemplary embodiment. FIG. 2 is a perspective view of a substrate of FIG. 1. FIG. 3 is a perspective view of a first semiconductor chip of FIG. 1. FIG. 4 is a cross-sectional view of the first semiconductor chip, which is taken along line I-I' of FIG. 3.

Referring to FIG. 1, a semiconductor package 1 in accordance with the first exemplary embodiment includes a substrate 100 having a first through opening 110, first and second semiconductor chips 200 and 300 which are sequentially stacked on the substrate 100 in a flip chip manner and respectively have second and third through openings 210 and 310, and a molding material 500 covering the first and second semiconductor chips 200 and 300 and filling up a space between the substrate 100 and the first semiconductor chip 200, a space between the first and second semiconductor chips 200 and 300, and the first to third through openings 110 to 310.

Referring to FIGS. 1 and 2, the substrate 100 may be, e.g., a wafer or printed circuit board (PCB). The substrate 100 may include a first surface 101 and a second surface 102 opposite each other. For example, the first surface 101 may be an active surface of the substrate 100, and the second surface 102 may be a backside surface of the substrate 100.

A plurality of first external connection terminals 150 may be formed on the first surface 101 of the substrate 100. The first external connection terminals 150 may be conductive balls or solder balls, without being limited thereto. Also, the first external connection terminals 150 may be conductive bumps, conductive spacers, a pin grid array (PGA), or the like. Further, the first and second semiconductor chips 200 and 300 may be sequentially stacked in a flip chip manner on the second surface 102 of the substrate 100.

The substrate 100 may include the first through opening 110. Although the substrate 100 includes one first through opening 110 in FIGS. 1 and 2, the number of the first through openings is not limited thereto. The first through opening 110 may be formed to pass through the substrate 100 from the first surface 101 to the second surface 102. The first through opening 110 may be formed between two first external connection terminals 150 adjacent to each other, but it is not limited thereto.

Since the first through opening 110 is formed in the substrate 100, in a molding process, the molding material 500 between the first semiconductor chip 200 and the substrate 100 may flow through the first through opening 110. As the fluidity of the molding material 500 increases, the molding material 500 may be efficiently filled between the first semiconductor chip 200 and the substrate 100. Accordingly, in the molding process, it is possible to prevent a void, without molding material 500, from being generated between the first semiconductor chip 200 and the substrate 100.

Referring to FIG. 1, the first through opening 110 may be filled with only the molding material 500. Further, a part of the molding material 500 may protrude from the first surface 101 of the substrate 100 through the first through opening 110 to thereby form a channel 510. The channel 510 may be located between two first external connection terminals 150 adjacent to each other, but it is not limited thereto.

First and second pads 120 and 130 may be located on the first and second surfaces 101 and 102 of the substrate 100, respectively. The first pads 120 may be electrically connected to the first external connection terminals 150 and the second pads 130 may be electrically connected to second external connection terminals 250.

Referring to FIG. 1, the first and second semiconductor chips 200 and 300 may be sequentially stacked, in a flip chip manner, on the second surface 102 of the substrate 100. Specifically, the first semiconductor chip 200 may be flip-chip bonded onto the substrate 100 through the second external connection terminals 250. Further, the second semiconductor chip 300 may be flip-chip bonded onto the first semiconductor chip 200 through third external connection terminals 350.

The first and second semiconductor chips 200 and 300 may include the second and third through openings 210 and 310 respectively. Although the first and second semiconductor chips 200 and 300 include one second through opening 210 and one third through opening 310 respectively in FIG. 1, the number of the second through openings and the number of the third through openings are not limited thereto. The second through opening 210 may be formed to pass through the first semiconductor chip 200 from a third surface 201 to a fourth surface 202. The third through opening 310 may be formed to pass through the second semiconductor chip 300 from a fifth surface 301 to a sixth surface 302. For example, the third surface 201 of the first semiconductor chip 200 and the fifth surface 301 of the second semiconductor chip 300 may be active surfaces (lower surfaces of the first and second semiconductor chips, respectively), and the fourth surface 202 of the first semiconductor chip 200 and the sixth surface 302 of the second semiconductor chip 300 may be backside surfaces (upper surfaces of the first and second semiconductor chips, respectively). Further, the second and third through openings 210 and 310 may be filled with only the molding material 500.

Since the first and second semiconductor chips 200 and 300 stacked on the substrate 100 include the second and third through openings 210 and 310 respectively, the molding material 500 may flow through the second and third through openings 210 and 310 in the molding process. Accordingly, in the molding process, the molding material 500 may be introduced into a space between the first semiconductor chip 200 and the second semiconductor chip 300 not only from both sides of the first and second semiconductor chips 200 and 300 but also through the third through opening 310. That is, the molding material 500 may be introduced into a space between the first semiconductor chip 200 and the second semiconductor chip 300 in various directions to fill up the space. Accordingly, the molding material 500 may be efficiently filled between the first semiconductor chip 200 and the second semiconductor chip 300. Accordingly, in the molding process, it is possible to prevent a void from being generated between the first semiconductor chip 200 and the second semiconductor chip 300.

Referring to FIGS. 3 and 4, the first semiconductor chip 200 may include a plurality of through electrodes 215. For example, the second through opening 210 may be formed between two through electrodes 215 adjacent to each other.

Referring to FIG. 1, third and fourth pads 220 and 230 may be located on the third and fourth surfaces 201 and 202 of the first semiconductor chip 200, respectively. Specifically, the third and fourth pads 220 and 230 may be electrically connected to the through electrodes 215. Further, the third pads 220 may be electrically connected to the second external connection terminals 250, and the fourth pads 230 may be electrically connected to the third external connection terminals 350.

Fifth pads 320 may be located on the fifth surface 301 of the second semiconductor chip 300, and the fifth pads 320 may be electrically connected to the third external connection terminals 350. Although the second semiconductor chip 300 does not include through electrodes in FIG. 1, without being limited thereto, through electrodes may be additionally formed in the second semiconductor chip 300.

Referring to FIG. 1, the molding material 500 may be filled between the substrate 100 and the first semiconductor chip 200, between the first and second semiconductor chips 200 and 300, and in the first to third through openings 110 to 310 while covering the first and second semiconductor chips 200 and 300. The molding material 500 may include, e.g., an epoxy molding compound (EMC), but it is not limited thereto.

Since the molding material 500 is filled not only between the substrate 100 and the first semiconductor chip 200 and between the first and second semiconductor chips 200 and 300 but also in the first to third through openings 110 to 310, it is possible to stably fix the first and second semiconductor chips 200 and 300 that are stacked on the substrate 100. Accordingly, it is possible to improve reliability of the semiconductor package 1.

Figure 5:
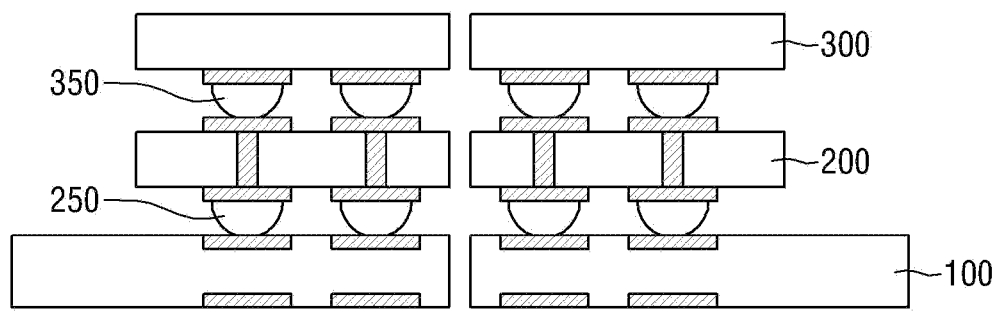
FIGS. 5 to 7 are cross-sectional views showing intermediate steps of a method for fabricating the semiconductor package of FIG. 1.
Figure 6:
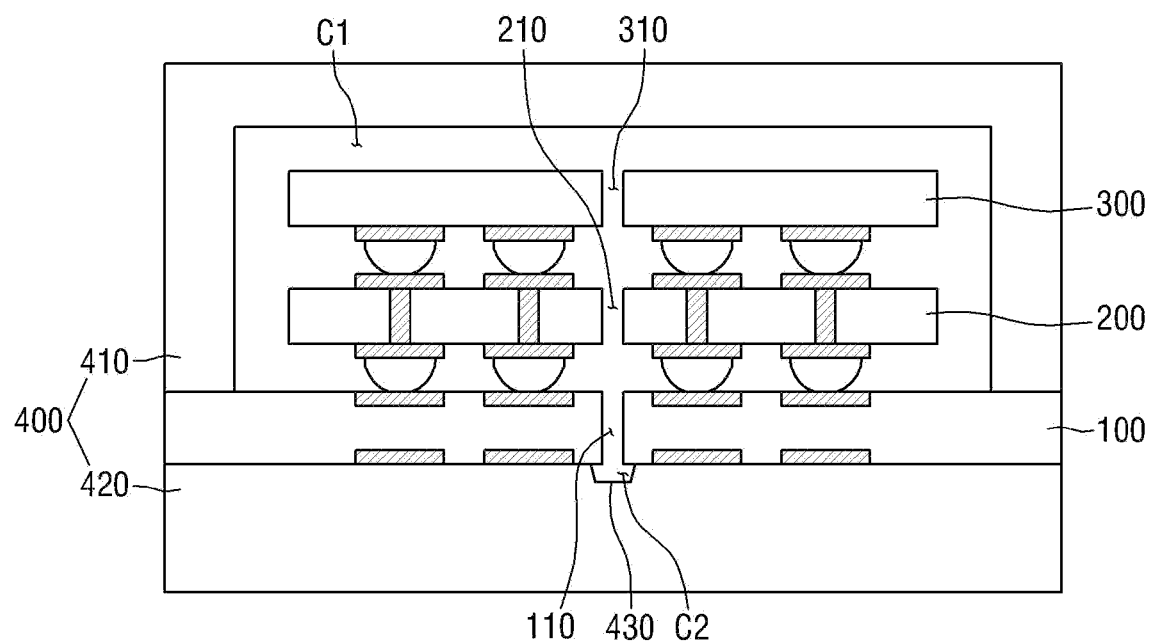
Figure 7:
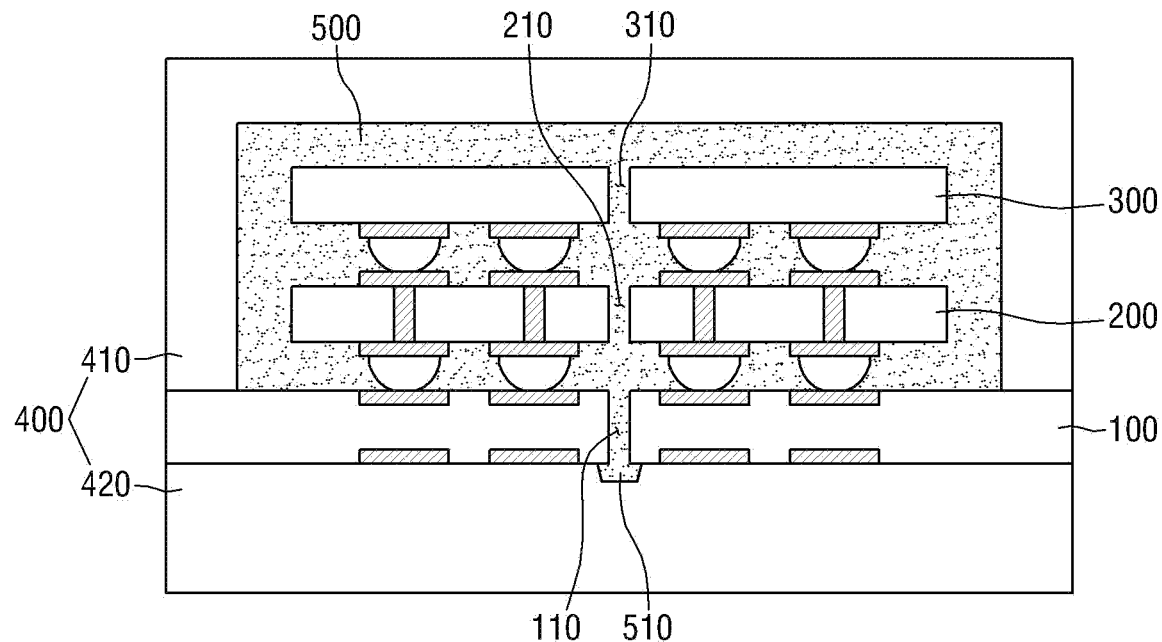

A method for fabricating the semiconductor package in accordance with the first embodiment will be described with reference to FIGS. 1 to 7. FIGS. 5 to 7 are cross-sectional views showing intermediate steps of the method for fabricating the semiconductor package of FIG. 1.

First, referring to FIGS. 1 to 4, the first through opening 110 may be formed in the substrate 100, and the second and third through openings 210 and 310 may be formed in the first and second semiconductor chips 200 and 300 respectively. The positions and numbers of the first to third through openings 110 to 310 are not limited to those of FIGS. 1 to 4.

Subsequently, referring to FIG. 5, the first and second semiconductor chips 200 and 300 may be stacked in a flip chip manner on the substrate 100.

Specifically, the first semiconductor chip 200 may be flip-chip bonded onto the substrate 100 through the second external connection terminals 250. Further, the second semiconductor chip 300 may be flip-chip bonded onto the first semiconductor chip 200 through the third external connection terminals 350. Further, the first and second semiconductor chips 200 and 300 may be stacked in a flip chip manner on the substrate 100 such that, for example, the first to third through openings 110 to 310 overlap one another.

Subsequently, referring to FIG. 6, the substrate 100 on which the first and second semiconductor chips 200 and 300 are sequentially stacked may be loaded in a mold 400.

The mold 400 may include an upper mold 410 and a lower mold 420, and the lower mold 420 may include a groove 430.

Specifically, the substrate 100 may be loaded in the mold 400 such that the first through opening 110 of the substrate 100 is positioned on the groove 430 of the lower mold 420. Further, the substrate 100 may be clamped by the upper mold 410 and the lower mold 420. A first cavity C1 may be formed to be surrounded by the second surface 102 of the substrate 100 and the upper mold 410. A second cavity C2 may be formed to be surrounded by the first surface 101 of the substrate 100 and the lower mold 420. The second cavity C2 is a space formed by the groove 430 of the lower mold 420.

Subsequently, referring to FIG. 7, the substrate 100 on which the first and second semiconductor chips 200 and 300 are sequentially stacked may be molded by injecting the molding material 500 in the mold 400. For example, the molding material 500 may be filled between the substrate 100 and the first semiconductor chip 200, between the first and second semiconductor chips 200 and 300, and in the first to third through openings 110 to 310 while covering the first and second semiconductor chips 200 and 300.

Specifically, the molding material 500 may be injected in the first cavity C1. The injected molding material 500 may fill up the first cavity C1 and the second cavity C2. While filling up the first cavity C1, the molding material 500 may fill up the space between the substrate 100 and the first semiconductor chip 200, and the space between the first and second semiconductor chips 200 and 300. For example, the molding material 500 may be introduced into the space between the substrate 100 and the first semiconductor chip 200 and the space between the first and second semiconductor chips 200 and 300 from both sides of the first and second semiconductor chips 200 and 300. Further, the molding material 500 may be introduced into the space between the substrate 100 and the first semiconductor chip 200 and the space between the first and second semiconductor chips 200 and 300 through the first to third through openings 110 to 310. Accordingly, since the molding material 500 may be introduced and flow through various routes, it is possible to efficiently fill the space between the substrate 100 and the first semiconductor chip 200 and the space between the first and second semiconductor chips 200 and 300 with the molding material 500. Accordingly, it is possible to prevent a void from being generated in the space between the substrate 100 and the first semiconductor chip 200 and the space between the first and second semiconductor chips 200 and 300.

Further, referring to FIG. 7, since the first to third through openings 110 to 310 overlap one another, the molding material 500 can more smoothly move in the space between the substrate 100 and the first semiconductor chip 200 and the space between the first and second semiconductor chips 200 and 300, thereby improving fillability of the molding material 500.

Further, in the method for fabricating the semiconductor package in accordance with the first embodiment, since the molding material 500 fills up the space between the substrate 100 and the first semiconductor chip 200 and the space between the first and second semiconductor chips 200 and 300 through the molding process, there is no need to perform an additional underfill process. Accordingly, in the method for fabricating the semiconductor package in accordance with the first embodiment, it is possible to simplify a process of fabricating the semiconductor package.

While the first cavity C1 is filled with the molding material 500, the first to third through openings 110 to 310 may be filled with the molding material 500. Further, while the second cavity C2 is filled with the molding material 500, it is possible to form the channel 510 in which a part of the molding material 500 protrudes from the first surface 101 of the substrate 100 through the first through opening 110.

Subsequently, referring to FIG. 1, the semiconductor package 1 formed by molding may be unloaded from the mold 400 and the first external connection terminals 150 may be formed on the first surface 101 of the substrate 100.

Figure 8:
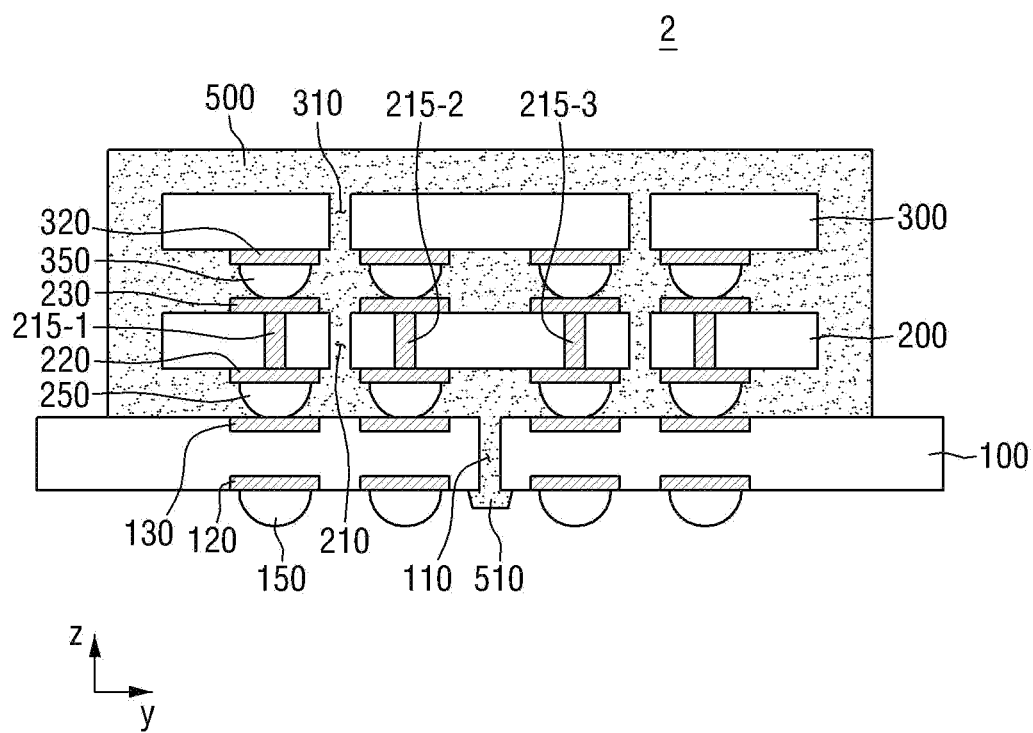
FIG. 8 is a cross-sectional view of the semiconductor package in accordance with a second exemplary embodiment.
Figure 9:
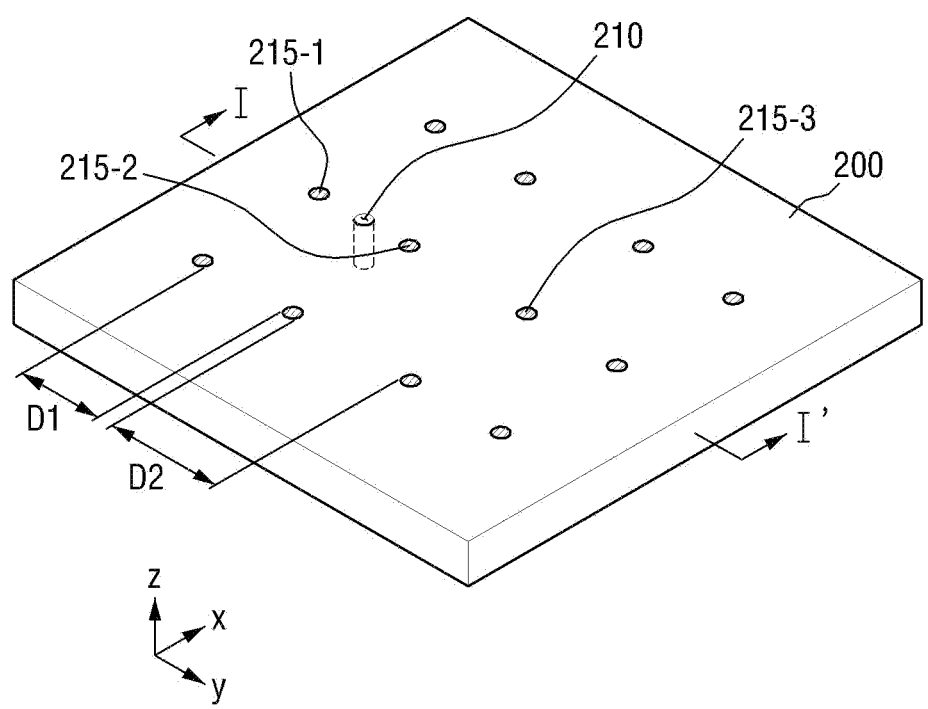
FIG. 9 is a perspective view of a substrate of FIG. 8.

A semiconductor package in accordance with a second exemplary embodiment will be described with reference to FIGS. 8 and 9. However, the description will be made focusing on a difference between the semiconductor package of the second exemplary embodiment and the semiconductor package of the first exemplary embodiment. FIG. 8 is a cross-sectional view of the semiconductor package in accordance with the second exemplary embodiment. FIG. 9 is a perspective view of a substrate of FIG. 8.

Referring to FIGS. 8 and 9, the through electrodes 215 may include first to third through electrodes 215-1, 215-2 and 215-3 which are sequentially arranged in a first direction (e.g., y direction). A distance D1 between the first through electrode 215-1 and the second through electrode 215-2 may be smaller than a distance D2 between the second through electrode 215-2 and the third through electrode 215-3.

The second through opening 210 may be located between the first and second through electrodes 215-1 and 215-2. That is, the second through opening 210 may be located in a region in which the through electrodes 215 are relatively dense. Since the through electrodes 215 are electrically connected to the second external connection terminals 250, the second external connection terminals 250 may be also dense in the region in which the through electrodes 215 are relatively dense. Accordingly, in a molding process of a semiconductor package 2, a void is likely to occur in the region in which the through electrodes 215 are relatively dense. In the semiconductor package 2 in accordance with the second exemplary embodiment, since the second through opening 210 is formed in the region of the first semiconductor chip 200 in which the through electrodes 215 are relatively dense, the molding material 500 may be introduced, through the second through opening 210, in the region in which the through electrodes 215 are relatively dense. Accordingly, since the molding material 500 is sufficiently filled between the second external connection terminals 250, it is possible to prevent a void from being generated between the substrate 100 and the first semiconductor chip 200.

Figure 10:
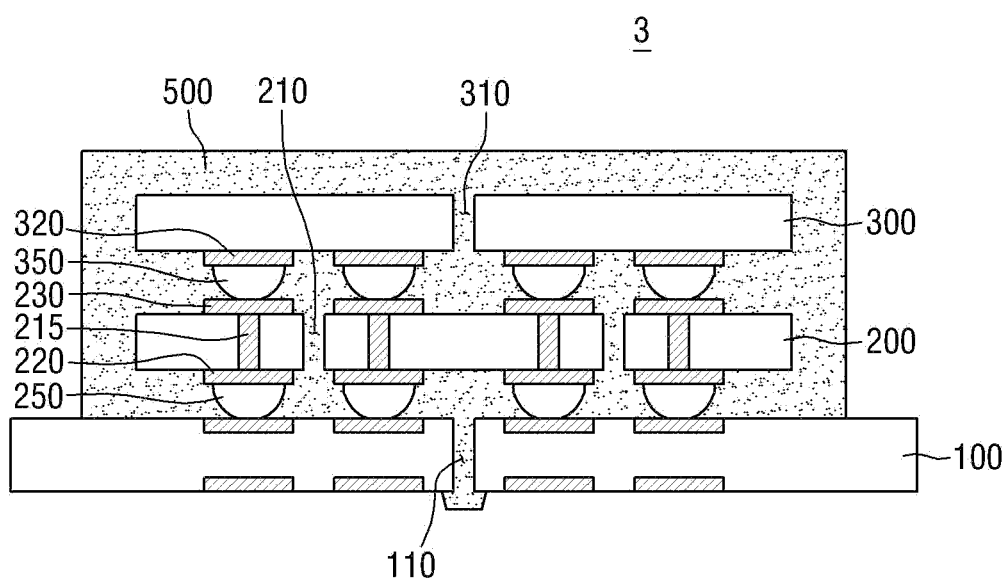
FIG. 10 is a cross-sectional view of a semiconductor package in accordance with a third exemplary embodiment.

A semiconductor package in accordance with a third exemplary embodiment will be described with reference to FIG. 10. However, the description will be made focusing on a difference between the semiconductor package of the third exemplary embodiment and the semiconductor package of the first exemplary embodiment. FIG. 10 is a cross-sectional view of the semiconductor package in accordance with the third exemplary embodiment.

Referring to FIG. 10, the second through opening 210 of the first semiconductor chip 200 and the third through opening 310 of the second semiconductor chip 300 do not overlap each other. Since the second through opening 210 and the third through opening 310 do not overlap each other, the molding material 500 introduced between the first and second semiconductor chips 200 and 300 through the third through opening 310 does not immediately flow into the second through opening 210. Accordingly, the molding material 500 introduced between the first and second semiconductor chips 200 and 300 through the third through opening 310 can be fully filled between the first and second semiconductor chips 200 and 300. Accordingly, it may be possible to enable efficient filling of the molding material 500.

Figure 11:
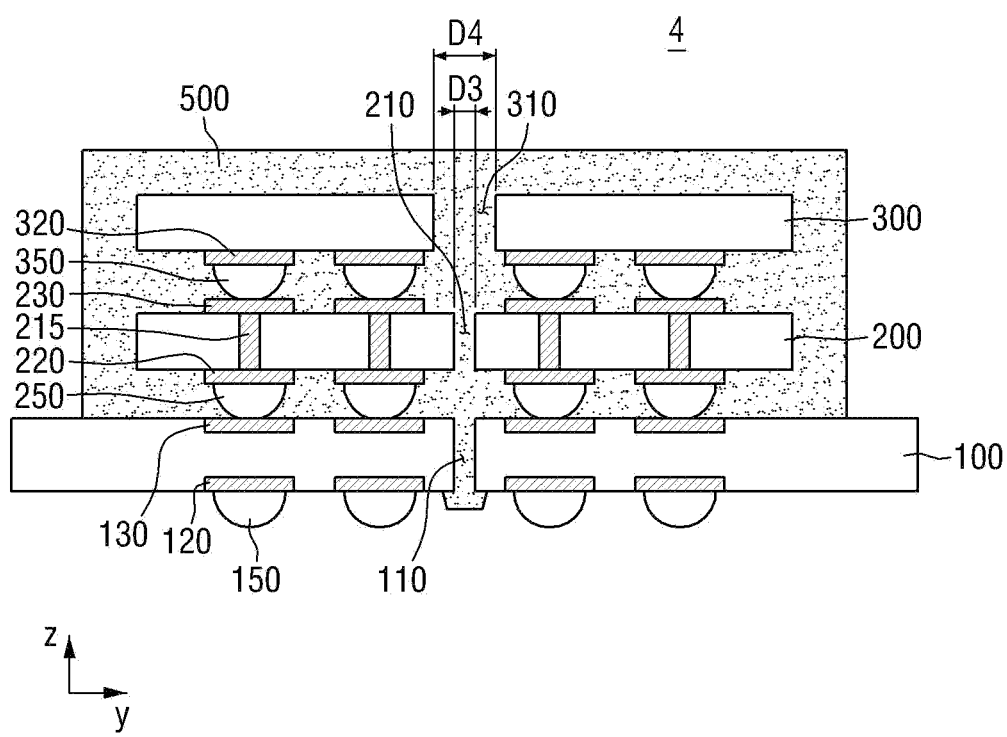
FIG. 11 is a cross-sectional view of a semiconductor package in accordance with a fourth exemplary embodiment.

A semiconductor package in accordance with a fourth exemplary embodiment will be described with reference to FIG. 11. However, the description will be made focusing on a difference between the semiconductor package of the fourth exemplary embodiment and the semiconductor package of the first exemplary embodiment. FIG. 11 is a cross-sectional view of the semiconductor package in accordance with the fourth exemplary embodiment.

Referring to FIG. 11, a cross-sectional size D3 of the second through opening 210 of the first semiconductor chip 200 may be different from a cross-sectional size D4 of the third through opening 310 of the second semiconductor chip 300. For example, the cross-sectional size D3 of the second through opening 210 may be larger than the cross-sectional size D4 of the third through opening 310, but it is not limited thereto.

For example, in a case where the molding material 500 is introduced between the first and second semiconductor chips 200 and 300 through the third through opening 310, since the cross-sectional size D3 of the second through opening 210 is relatively small, it is possible to reduce the amount of the molding material 500 flowing into the second through opening 210. By adjusting the sizes of the second and third through openings 210 and 310, it is possible to adjust the flow of the molding material 500. Accordingly, it is possible to efficiently fill the molding material 500 in the space between the first and second semiconductor chips 200 and 300.

Figure 12:
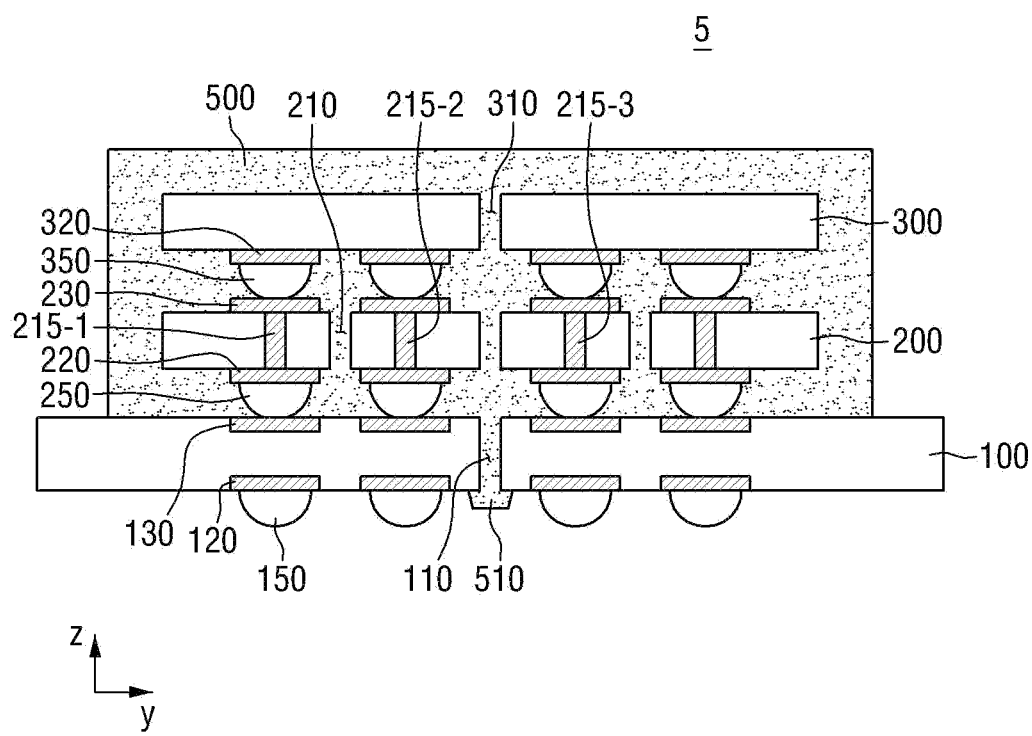
FIG. 12 is a cross-sectional view of a semiconductor package in accordance with a fifth exemplary embodiment.

A semiconductor package in accordance with a fifth exemplary embodiment will be described with reference to FIG. 12. However, the description will be made focusing on a difference between the semiconductor package of the fifth exemplary embodiment and the semiconductor package of the first exemplary embodiment. FIG. 12 is a cross-sectional view of the semiconductor package in accordance with the fifth exemplary embodiment.

Referring to FIG. 12, the number of the second through openings 210 of the first semiconductor chip 200 may be different from the number of the third through openings 310 of the second semiconductor chip 300. For example, the number of the second through openings 210 may be relatively larger than the number of the third through openings 310, but it is not limited thereto.

For example, the through electrodes 215 of the first semiconductor chip 200 may include first to third through electrodes 215-1, 215-2 and 215-3 which are sequentially arranged in a first direction (e.g., y direction). A distance between the first through electrode 215-1 and the second through electrode 215-2 may be smaller than a distance between the second through electrode 215-2 and the third through electrode 215-3. Further, the second through openings 210 may be formed between the first and second through electrodes 215-1 and 215-2 and between the second and third through electrodes 215-2 and 215-3, respectively. Since the through electrodes 215 are formed in various positions of the first semiconductor chip 200, the molding material 500 may more smoothly flow in the molding process.

Figure 13:
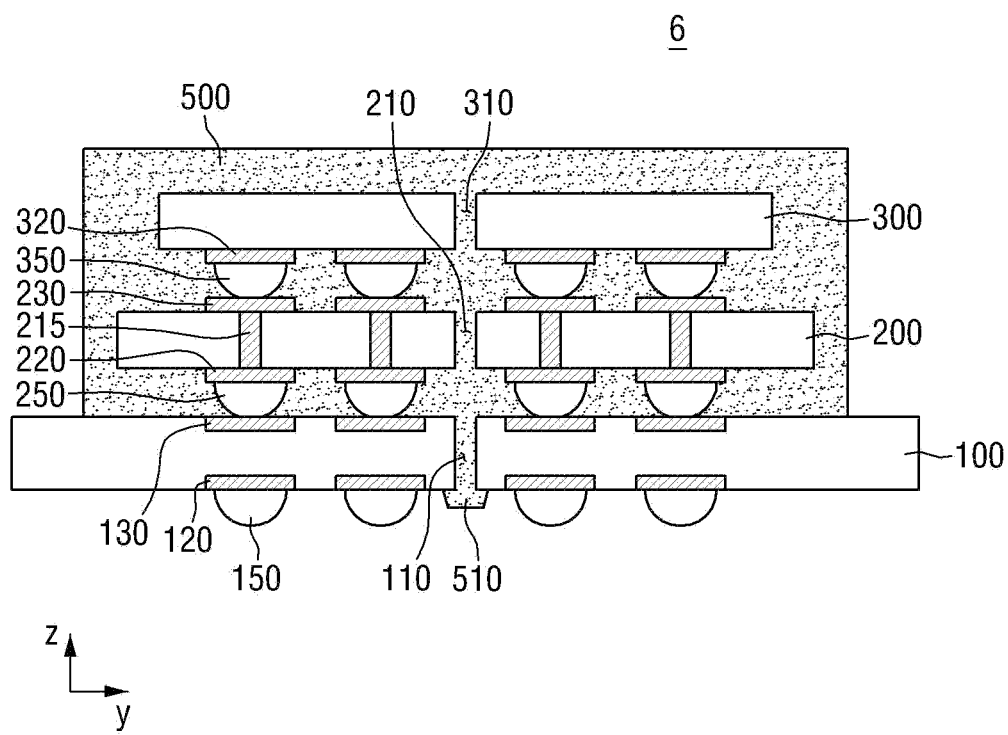
FIG. 13 is a cross-sectional view of a semiconductor package in accordance with a sixth embodiment.

A semiconductor package in accordance with a sixth exemplary embodiment will be described with reference to FIG. 13. However, the description will be made focusing on a difference between the semiconductor package of the sixth exemplary embodiment and the semiconductor package of the first exemplary embodiment. FIG. 13 is a cross-sectional view of the semiconductor package in accordance with the sixth exemplary embodiment.

Referring to FIG. 13, the size of the first semiconductor chip 200 may be different from the size of the second semiconductor chip 300. That is, a semiconductor package 6 in accordance with the sixth exemplary embodiment may be formed by stacking different types of semiconductor chips.

Figure 14:
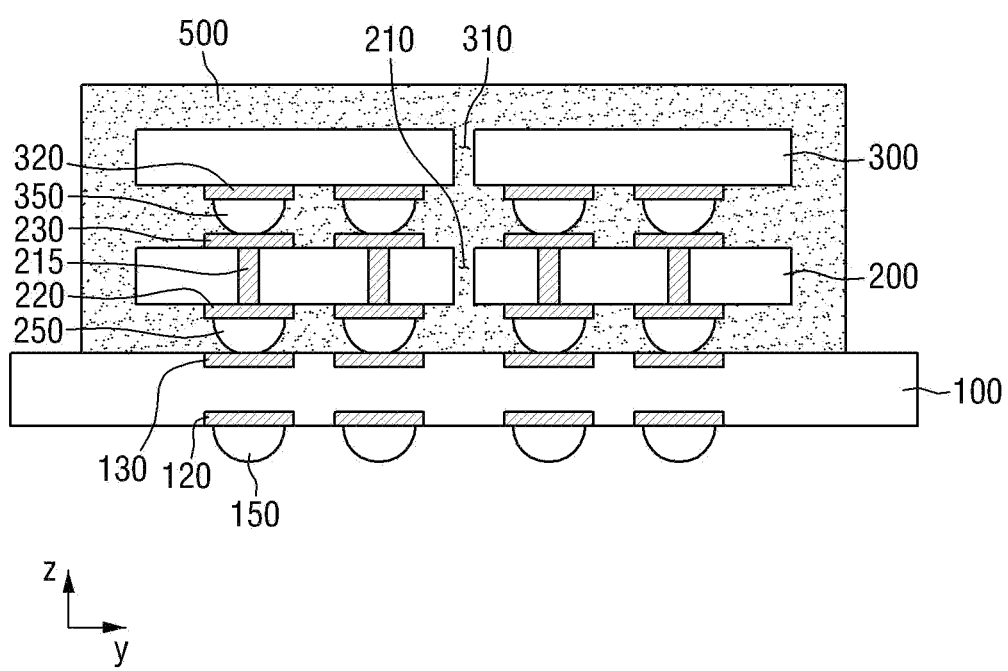
FIG. 14 is a cross-sectional view of a semiconductor package in accordance with a seventh exemplary embodiment.

A semiconductor package in accordance with a seventh exemplary embodiment will be described with reference to FIG. 14. However, the description will be made focusing on a difference between the semiconductor package of the seventh exemplary embodiment and the semiconductor package of the first exemplary embodiment. FIG. 14 is a cross-sectional view of the semiconductor package in accordance with the seventh exemplary embodiment.

Referring to FIG. 14, no through opening is formed in the substrate 100. However, since the second and third through openings 210 and 310 are formed in the first and second semiconductor chips 200 and 300 respectively, it is possible to prevent a void from being generated in a molding process of a semiconductor package 7 in accordance with the seventh exemplary embodiment.

Figure 15:
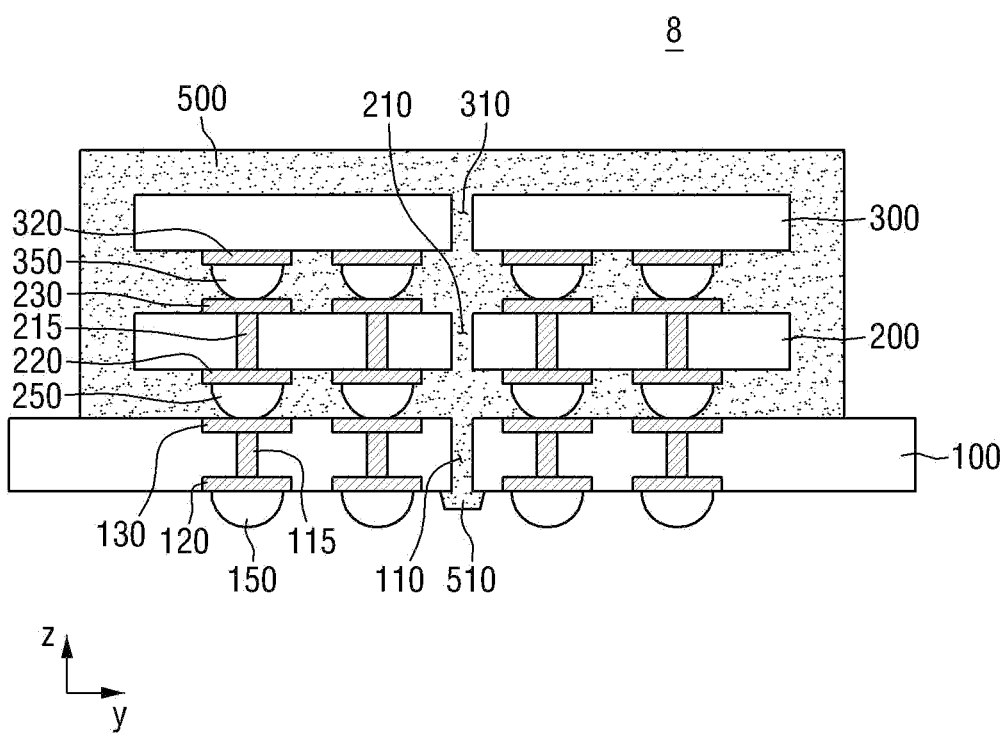
FIG. 15 is a cross-sectional view of a semiconductor package in accordance with an eighth exemplary embodiment.

A semiconductor package in accordance with an eighth exemplary embodiment will be described with reference to FIG. 15. However, the description will be made focusing on a difference between the semiconductor package of the eighth exemplary embodiment and the semiconductor package of the first exemplary embodiment. FIG. 15 is a cross-sectional view of the semiconductor package in accordance with the eighth exemplary embodiment.

Referring to FIG. 15, substrate through electrodes 115 may be formed in the substrate 100. For example, the substrate 100 may be a wafer, but it is not limited thereto. The first and second pads 120 and 130 may be electrically connected to the substrate through electrodes 115.

Figure 16:
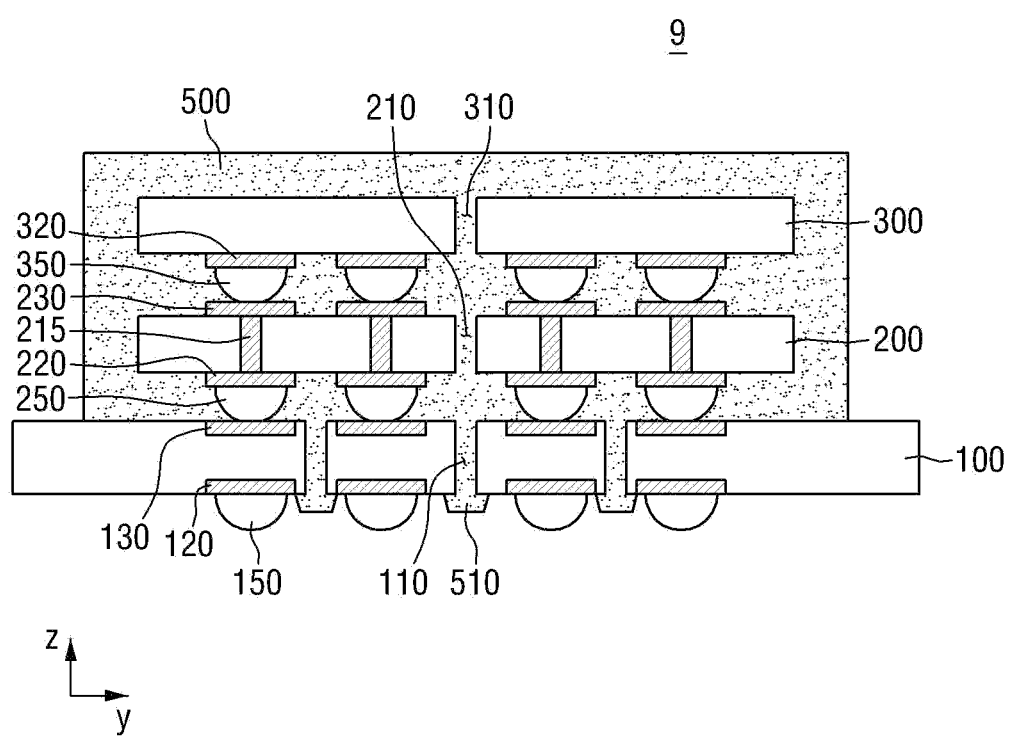
FIG. 16 is a cross-sectional view of a semiconductor package in accordance with a ninth exemplary embodiment.

A semiconductor package in accordance with a ninth exemplary embodiment will be described with reference to FIG. 16. However, the description will be made focusing on a difference between the semiconductor package of the ninth exemplary embodiment and the semiconductor package of the first exemplary embodiment. FIG. 16 is a cross-sectional view of the semiconductor package in accordance with the ninth exemplary embodiment.

Referring to FIG. 16, the substrate 100 may include a plurality of first through openings 110 filled with the molding material 500. Further, a semiconductor package 9 may include a plurality of channels 510. Since the substrate 100 includes a plurality of first through openings 110, it is possible to improve filling efficiency of the molding material 500 in a molding process.

Figure 17:
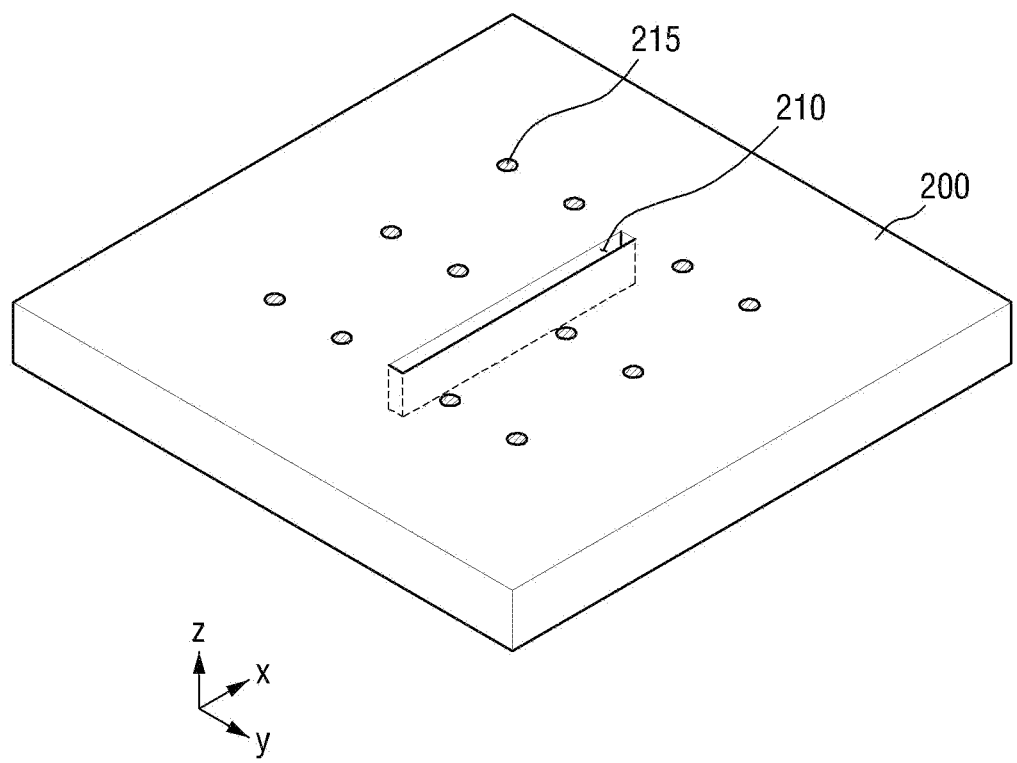
FIG. 17 is a perspective view of a substrate included in a semiconductor package in accordance with a tenth exemplary embodiment.

A semiconductor package in accordance with a tenth exemplary embodiment will be described with reference to FIG. 17. However, the description will be made focusing on a difference between the semiconductor package of the tenth exemplary embodiment and the semiconductor package of the first exemplary embodiment. FIG. 17 is a perspective view of a substrate included in the semiconductor package in accordance with the tenth exemplary embodiment.

Referring to FIG. 17, the through electrodes 215 may be sequentially arranged by forming one row in a second direction (e.g., x direction) of the first semiconductor chip 200. The second through opening 210 may have a slit shape extending in the second direction. In a case where the second through opening 210 has a slit shape, since the sectional area of the second through opening 210 becomes large, the molding material 500 may more smoothly flow in a molding process. Accordingly, it is possible to achieve efficient filling of the molding material 500, thereby preventing a void from being generated.

Semiconductor systems in accordance with the first to third exemplary embodiments will be described with reference to FIGS. 18 to 21.

Figure 18:
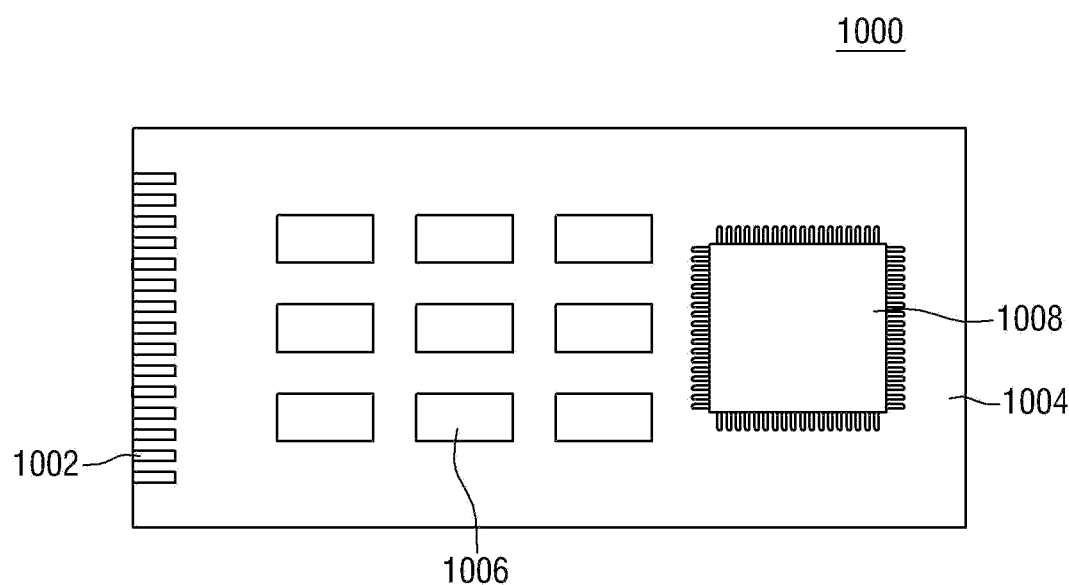
FIG. 18 is a plan view showing a semiconductor system in accordance with the first exemplary embodiment.

FIG. 18 is a plan view showing a semiconductor system in accordance with the first exemplary embodiment.

Referring to FIG. 18, a semiconductor system 1000 in accordance with the first exemplary embodiment may be a package module. The semiconductor system 1000 may include a module substrate 1004 having external connection terminals 1002 and semiconductor devices 1006 and 1008. Although a quad flat package (QFP) is exemplarily illustrated as the semiconductor device 1008, it is not limited thereto. In this case, the semiconductor devices 1006 and 1008 may be implemented by using at least one of the semiconductor packages that have been described with reference to FIGS. 1 to 17. That is, the semiconductor devices 1006 and 1008 may be implemented using a semiconductor package including a substrate having a first through opening, first and second semiconductor chips which are sequentially stacked on the substrate in a flip chip manner and have second and third through openings respectively, and a molding material filling up a space between the substrate and the first semiconductor chip, a space between the first and second semiconductor chips and the first to third through openings while covering the first and second semiconductor chips.

Figure 19:
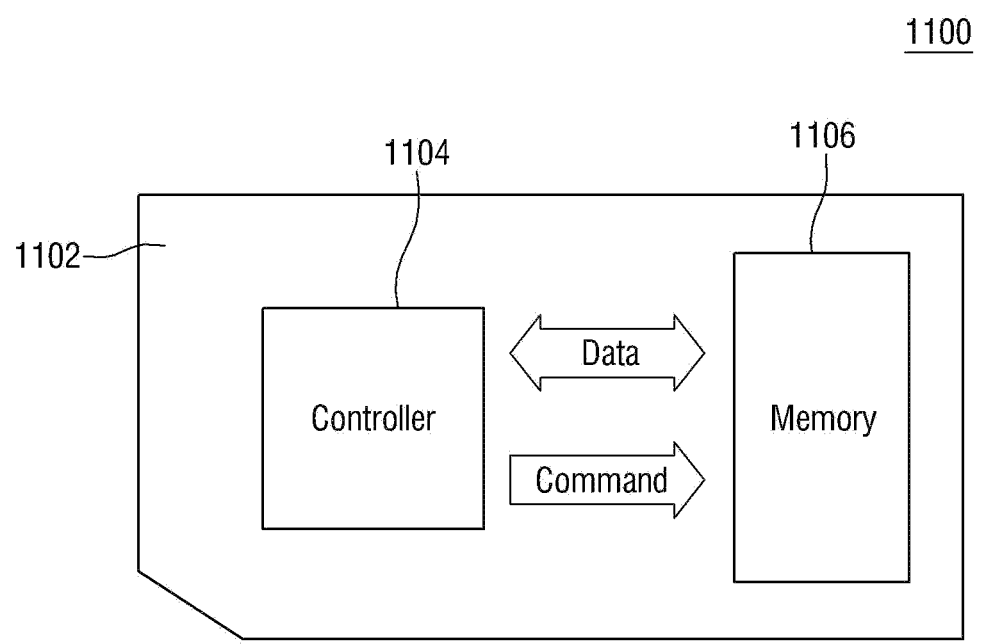
FIG. 19 is a block diagram showing a semiconductor system in accordance with the second exemplary embodiment.

FIG. 19 is a block diagram showing a semiconductor system in accordance with the second exemplary embodiment.

Referring to FIG. 19, a semiconductor system 1100 in accordance with the second exemplary embodiment may be a memory card. The semiconductor system 1100 may include a controller 1104 and a memory 1106 in a housing 1102. The controller 1104 and the memory 1106 may exchange electrical signals. For example, the memory 1106 and the controller 1104 may send and receive data according to commands of the controller 1104. Accordingly, the semiconductor system 1100 may store data in the memory 1106 or output data from the memory 1106 to the outside. The controller 1104 and the memory 1106 may be implemented by using at least one of the semiconductor packages that have been described with reference to FIGS. 1 to 17.

The semiconductor system 1100 may be used as a data storage medium of various portable apparatuses. For example, the semiconductor system 1100 may include a multimedia card (MMC) or a secure digital (SD) card.

Figure 20:
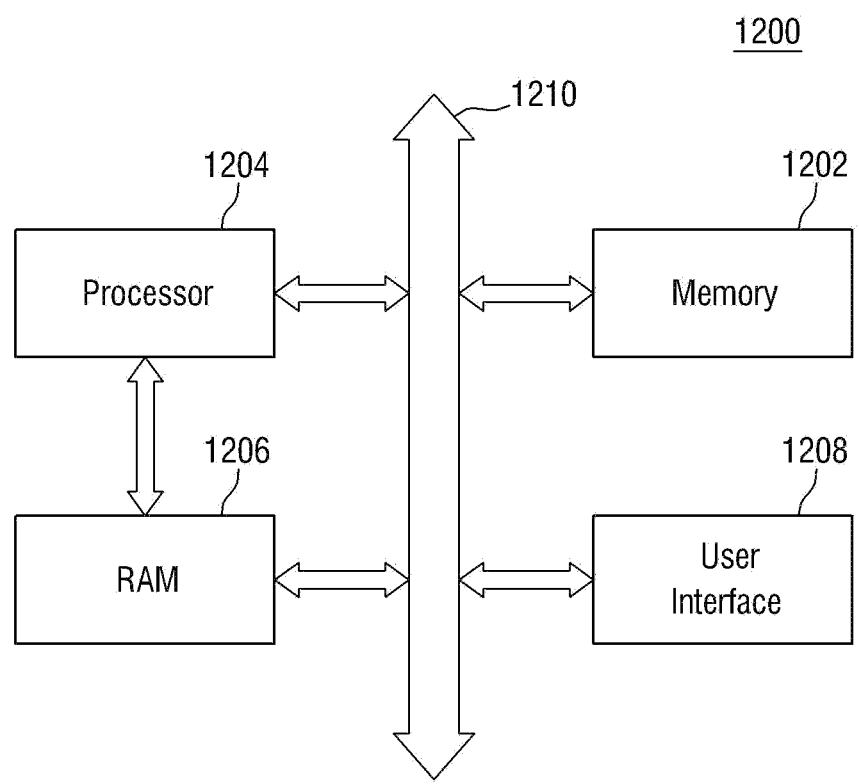
FIG. 20 is a block diagram showing a semiconductor system in accordance with the third exemplary embodiment.
Figure 21:
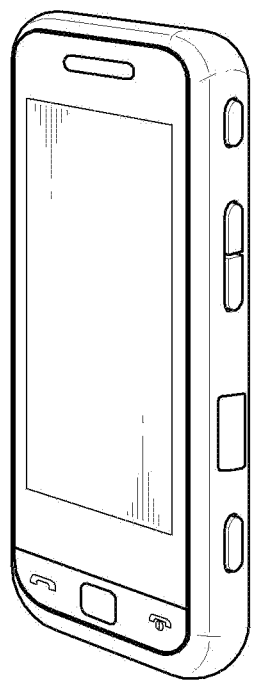
FIG. 21 illustrates an example of an electronic apparatus to which the semiconductor system in accordance with the third exemplary embodiment is applied.

FIG. 20 is a block diagram showing a semiconductor system in accordance with the third exemplary embodiment. FIG. 21 illustrates an example of an electronic apparatus to which the semiconductor system in accordance with the third exemplary embodiment is applied.

Referring to FIG. 20, a semiconductor system 1200 in accordance with the third exemplary embodiment may include a memory system 1202, a processor 1204, a RAM 1206, and a user interface 1208, which can communicate data with each other using a bus 1210. The processor 1204 may serve to execute a program and control the semiconductor system 1200. The RAM 1206 may be used as an operation memory of the processor 1204. The processor 1204 and the RAM 1206 may be included in one package. For example, a logic chip including the processor 1204 and a memory chip including the RAM 1206 may be included in a system-in-package to perform wireless communication with each other. The user interface 1208 may be used to input/output data to/from the semiconductor system 1200. The memory system 1202 may store a code for operating the processor 1204, data processed by the processor 1204 or data inputted from the outside. The memory system 1202 may include a controller and a memory, and have a configuration substantially equal or similar to that of the memory card 1100 of FIG. 19.

Meanwhile, the semiconductor system 1200 in accordance with the third exemplary embodiment may be applied to an electronic control unit of various electronic apparatuses. For example, the semiconductor system may be applied to a cellular phone 1300 of FIG. 21. Besides, the semiconductor system 1200 may be applied to a portable game console, a portable laptop, a MP3 player, a navigation system, a solid-state disk (SSD), a car or a household appliance.

While the present inventive concept has been particularly shown and described with reference to exemplary embodiments thereof, it will be understood by those of ordinary skill in the art that various changes in form and details may be made therein without departing from the spirit and scope as defined by the following claims. It is therefore desired that the exemplary embodiments be considered in all respects as illustrative and not restrictive, reference being made to the appended claims rather than the foregoing description to indicate the scope of the inventive concept.

What is claimed is:

1. A semiconductor package comprising:
   a substrate comprising a first opening formed therethrough;
   a first semiconductor chip stacked on the substrate in a flip chip manner and comprising a second opening formed therethrough;
   a second semiconductor chip stacked on the first semiconductor ship in a flip chip manner and comprising a third opening formed therethrough; and
   a molding material covering the first semiconductor chip and the second semiconductor chip and filling a space between the substrate and the first semiconductor chip, a space between the first semiconductor chip and the second semiconductor chip, and each of the first opening, the second opening, and the third opening.

2. The semiconductor package of claim 1, wherein the first semiconductor chip comprises a plurality of through electrodes, and
   the second opening is formed through the first semiconductor chip between a first through electrodes and a second through electrode adjacent to the first through electrode.

3. The semiconductor package of claim 1, wherein the first semiconductor chip comprises a first through electrode, a second through electrode, and a third through electrode, sequentially arranged in a first direction,
   a distance between the first through electrode and the second through electrode is smaller than a distance between the second through electrode and the third through electrode, and
   the second opening is formed between the first through electrode and the second through electrode.

4. The semiconductor package of claim 1, wherein the first semiconductor chip comprises a plurality of through electrodes which are arranged in a first direction, and
   the second opening extends in the first direction.

5. The semiconductor package of claim 1, wherein the first opening passes through the substrate from a first surface of the substrate to a second surface of the substrate,
   a part of the molding material protrudes from the first surface of the substrate through the first opening to form a channel, and
   the first semiconductor chip is stacked on the second surface of the substrate.

6. The semiconductor package of claim 1, wherein the first opening, the second opening, and the third opening all overlap one another.

7. The semiconductor package of claim 1, wherein a size of the first semiconductor chip is different from a size of the second semiconductor chip.

8. The semiconductor package of claim 7, wherein the first semiconductor chip comprises a plurality of the second openings,
   the second semiconductor chip comprises a plurality of the third opening, and
   a number of the second openings is different from a number of the third openings.

9. The semiconductor package of claim 1, wherein a cross-sectional size of the second opening is different from a cross-sectional size of the third opening.

10. The semiconductor package of claim 1, wherein the molding material includes an epoxy molding compound.

11. The semiconductor package of claim 1, wherein the first opening, the second opening and the third opening are all filled with the molding material.

12. A semiconductor package comprising:
    a substrate comprising a first opening therethrough;
    a first semiconductor chip which is flip-chip bonded onto the substrate and comprises a second opening therethrough and a first through electrode, a second through electrode, and a third through electrode sequentially arranged in a first direction; and
    an epoxy molding compound (EMC) covering the first semiconductor chip, and filling up a space between the substrate and the first semiconductor chip, the first opening, and the second openings,
    wherein a distance between the first through electrode and the second through electrode is smaller than a distance between the second through electrode and the third through electrode, and
    the second through opening is formed between the first through electrode and the second through electrode.

13. The semiconductor package of claim 12, wherein the first semiconductor chip further comprises a third opening formed between the second through electrode and the third through electrode, and
    the first opening, the second opening, and the third opening are filled with the EMC.

14. The semiconductor package of claim 13, wherein the first opening and the second opening overlap each other.

15. The semiconductor package of claim 12, wherein the first opening passes through the substrate from a first surface of the substrate to a second surface of the substrate,
    a part of the EMC protrudes from the first surface of the substrate through the first opening to form a channel, and
    the first semiconductor chip is flip-chip bonded onto the second surface of the substrate.

16. A semiconductor package comprising:
a substrate, a first semiconductor chip flip chip mounted on the substrate, and a second semiconductor chip flip chip mounted on the first semiconductor chip;
wherein at least one first opening is formed through the substrate from a first surface of the substrate to a second surface of the substrate, at least one second opening is formed through the first semiconductor chip from a first surface of the first semiconductor chip to a second surface of the first semiconductor chip, and at least one third opening is formed through the second semiconductor chip from a first surface of the second semiconductor chip to a second surface of the second semiconductor chip; and
wherein the semiconductor package further comprises a molding material disposed between the substrate and the first semiconductor chip, between the first semiconductor chip and the second semiconductor chip, and within each of the at least one first opening, the at least one second opening, and the at least one third opening.

17. The semiconductor package of claim 16 wherein at least one second opening comprises a plurality of openings.

18. The semiconductor package of claim 16, wherein:
the first semiconductor further comprises a first through electrode, a second through electrode, and a third through electrode, wherein a spacing between the first through electrode and the second through electrode is smaller than a spacing between the second through electrode and the third through electrode, and
the at least one second opening is disposed between the first through electrode and the second through electrode.

19. The semiconductor package of claim 16, wherein the at least one first opening overlaps with the at least one second opening and with the at least one third opening.

* * * * *